US006298469B1

(12) United States Patent
Yin

(10) Patent No.: US 6,298,469 B1
(45) Date of Patent: Oct. 2, 2001

(54) METHOD AND SYSTEM FOR ALLOWING AN INTEGRATED CIRCUIT TO BE PORTABLY GENERATED FROM ONE MANUFACTURING PROCESS TO ANOTHER

(75) Inventor: Patrick Yin, Fremont, CA (US)

(73) Assignee: Aspec Technology, Inc., Sunnyvale, CA (US)

( * ) Notice: Subject to any disclaimer, the term of this patent is extended or adjusted under 35 U.S.C. 154(b) by 1040 days.

(21) Appl. No.: 08/688,218

(22) Filed: Jul. 29, 1996

Related U.S. Application Data

(63) Continuation of application No. 08/438,164, filed on May 9, 1995, now abandoned.

(51) Int. Cl.$^7$ .................................................. G06F 17/50
(52) U.S. Cl. .................................. 716/3; 716/1; 716/11; 716/8
(58) Field of Search ..................... 364/488–491; 366/488–491, 578; 716/3, 1, 8, 11

(56) References Cited

U.S. PATENT DOCUMENTS

| 5,018,074 | | 5/1991 | Griffith et al. ........................ 716/19 |
| 5,095,441 | * | 3/1992 | Hooper et al. ........................ 716/18 |
| 5,150,309 | * | 9/1992 | Shaw et al. .............................. 716/8 |
| 5,197,016 | * | 3/1993 | Sugimoto et al. ....................... 716/8 |
| 5,267,175 | * | 11/1993 | Hooper ................................... 716/18 |
| 5,303,161 | * | 4/1994 | Burns et al. .............................. 716/9 |
| 5,307,504 | * | 4/1994 | Robinson et al. ...................... 712/41 |
| 5,311,442 | | 5/1994 | Fukushima ............................ 716/18 |
| 5,351,197 | * | 9/1994 | Upton et al. ........................... 716/10 |
| 5,398,336 | * | 3/1995 | Tantry et al. ........................ 707/103 |
| 5,452,239 | * | 9/1995 | Dai et al. ............................... 703/19 |
| 5,550,839 | * | 8/1996 | Buch et al. ........................... 714/724 |

FOREIGN PATENT DOCUMENTS

WO95/05637    2/1995  (WO) ............................ G06F/15/60

OTHER PUBLICATIONS

Lisanke, Robert et al., "McMAP: A Fast Technology Mapping Procedure for Multi–Level Logic Synthesis," *IEEE*, New York, NY, Oct. 3–5, 1988, pp. 252–256.

* cited by examiner

*Primary Examiner*—Matthew Smith
*Assistant Examiner*—Vuthe Siek
(74) *Attorney, Agent, or Firm*—Sawyer Law Group LLP

(57) ABSTRACT

A system and method is provided which generates integrated circuits for integrated circuits that are portable from process to process. Information generated from an integrated circuit manufactured on a first process is utilized in combination with the parameters of a subsequent manufacturing process to obtain an integrated circuit based upon that second manufacturing process. Through this system and method a particular integrated circuit design is portable from process to process.

11 Claims, 3 Drawing Sheets

METHOD AND SYSTEM FOR ALLOWING AN INTEGRATED CIRCUIT TO BE PORTABLY GENERATED FROM ONE MANUFACTURING PROCESS TO ANOTHER

This application is a continuation application(s) Ser. No. 08/438,164 filed on May 9, 1995, now abandoned.

FIELD OF THE INVENTION

The present invention is directed toward generating integrated circuits and more particularly to a system and method for producing an integrated circuit that can be portably produced regardless of the manufacturing process.

BACKGROUND OF THE INVENTION

Integrated circuits are designed in a variety of fashions for a variety of purposes. Initially, a custom cell or megacell is designed which comprises a collection of gates and transistors and interconnections therebetween.

For a conventional circuit, there is a preexisting integrated circuit design environment including a schematic capture station, a logic simulator, timing verifier, and circuit simulator. The hardware of such design environments generally minimally comprises a computer, keyboard, graphic display means (such as a color graphic CRT display system), and graphic input means (such as a mouse or a digitizing tablet). Generally the hardware would be based upon a commercially available computer workstation, such as those provided by Sun Microsystems or by Apollo Computer Incorporated, and the software of the design environment would be provided as an set of tools by one or more cadence manufacturer, such as the design environments provided by Mentor Graphics Incorporated. There also exists a logic schematic prepared on the schematic capture station for which an accurate logic simulation is desired, and from which a net-list has been prepared. A net-list is a file comprising descriptions of the logic primitives (e.g., AND/OR gates, etc.) used in the logic schematic and the connectivity therebetween. This is generally accomplished automatically by the schematic capture system upon completion of the logic schematic, although some systems may require an additional step of logic compilation, whereby the user invokes a program to perform the process of conversion of the graphical schematic data to a net-list. In any case, the capability of net-list generation is widely known and implemented in all present schematic design environments.

Traditionally, the physical layout design is done with physical layout tools, known generically as "polygon editor". Experienced layout designers are employed to manually design such integrated circuits with the sole objective of creating a very area efficient design. One of the most important constraints in a layout design is the process layout design rules, which specify the spatial characteristics and limits of each process mask layer and the relationships between multiple layers. These design rules are process technology specific. The major drawbacks of the traditional approach in custom cell (integrated circuit) design are (1) time consuming, (2) not easily adaptable to new processes, and (3) very poor in terms of logic/timing simulation capability.

In addition, it is not possible to provide an accurate simulation model for such integrated circuits. Typically, "behavioral model" is used to describe the functionality of the cell. "Behavioral models" in great majority of cases do not adequately model the cells' functional and timing characteristics. Furthermore, there is often a need to have the same custom cells in different "processes"(as in fabrication), either to increase circuit performance, or to have alternate sources for the product or to be integrated in another design. Accordingly, what is needed is a system which allows for the migration of a particular integrated circuit portably from one process to another process quickly and accurately. In addition, what is needed is a design methodology that will allow for an integrated circuit design to be used over and over again with only minor modifications and within a variety of process environments. The present invention addresses such a need.

SUMMARY OF THE INVENTION

A method and system for taking a first integrated circuit from a first manufacturing process and generating a second integrated circuit for a second manufacturing process is disclosed. The method and system comprises providing a first library from the first integrated circuit, the first library defining the characteristics of the first gate array, and mapping and characterizing the first library from the first integrated circuit into a set of design criteria for the second manufacturing process.

The method and system in accordance with the second aspect also includes generating a plurality of a methodology and system of databases representing libraries and information about the design. The database will include the following information: physical cell library, logic device library, timing model library for the logic devices, design netlist and physical connectivity of the logic devices. In addition, the integrated circuit's physical size, functional behavior and timing characteristics are fully defined by the above database. The method and system in accordance with the present invention also enables mapping of physical database to allow for the recharacterizing of the timing models from one IC fabrication process to any other IC fabrication process. Accordingly through a system and method in accordance with the present invention, an integrated circuit can be portably manufactured on a plurality of different manufacturing processes. The method and system therefore has significant advantages over known conventional integrated circuit design processes.

DETAILED DESCRIPTION

Figure 1:
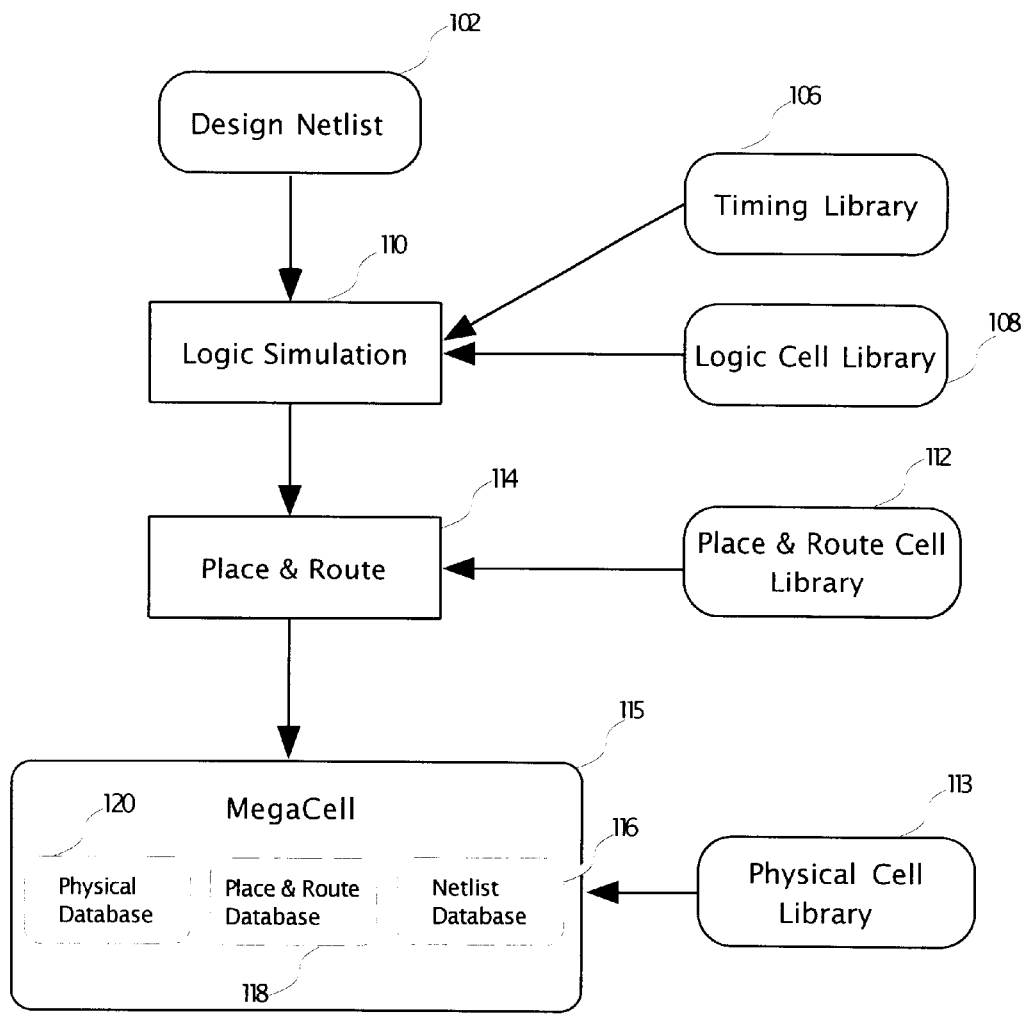
FIG. 1 is a diagram that shows the necessary required design flow in this system for designing core integrated circuit with a first manufacturing process.

The present invention is directed toward a system and method for generating a design for an integrated circuit regardless of the manufacturing process being utilized.

The following description is presented to enable one of ordinary skill in the art to make and use the invention as provided in the context of a particular application and its requirements. Various modifications to the preferred embodiment will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

In a conventional system for designing an integrated circuit for integrated circuits, a logic designer would prepare a schematic or a block diagram of the particular integrated circuit and then would provide this block diagram or schematic to an expert in layout design. The layout designer would then utilize the schematic and a netlist showing the different characteristics of the devices to be used to design the layout of the circuit. This type of methodology would oftentimes provide an efficiently organized integrated circuit. However, such a system also consumes many man hours of time for design.

One of the problems of the above identified methodology is that for the design to be portable from one process to the other, e.g, from an older fabrication process to a newer, more advanced one, significant work on the part of the layout designer is required. Typically the approach would be to linearly scale down or "shrink" the different devices that are part of the design. However, this is oftentimes not adequate or practical because (1) not all the layout design rules (constraints), i.e. "contact" size and "metal overlapping contact amount" do not change by the same proportion, and (2) not all the devices (therefore circuit parameters) change at the same rate. That is, a resistor utilized in the integrated circuit may change at one rate from one to another process where a transistor in the same circuit may change at another when manufacturing is transferring the manufacturing from one process to another. In addition, through this conventional process it is not possible to obtain an accurate simulation model when moving from one process to another. Applicant, through the present invention, has provided a method for being able to move from process to process and still have accurate information about the device.

To more specifically describe the features of the present invention, a few terms will be defined. In the context of the present application, "Netlist" means the connectivity information of various logic elements of the integrated circuit. The "Timing Library" for a specific integrated circuit means the library of timing models speed, delay, etc. of the corresponding "logic library". The "Logic Cell Library" means the library of logic elements. The "Place and Route" database indicates a symbolic representation of the physical connection of the devices. Finally, the "Physical Cell Library" is the library which comprises the actual physical layers, or the different dimensions of the various layers of the corresponding "Logic Library".

In a system and method in accordance with the present invention once an integrated circuit is designed in one process, the integrated circuit can be portably manufactured on another process. To more particularly describe the advantages and features of the present invention refer now to FIGS. 1–3 which are diagrams showing the design for generating an integrated circuit in accordance with the present invention.

Figure 2:
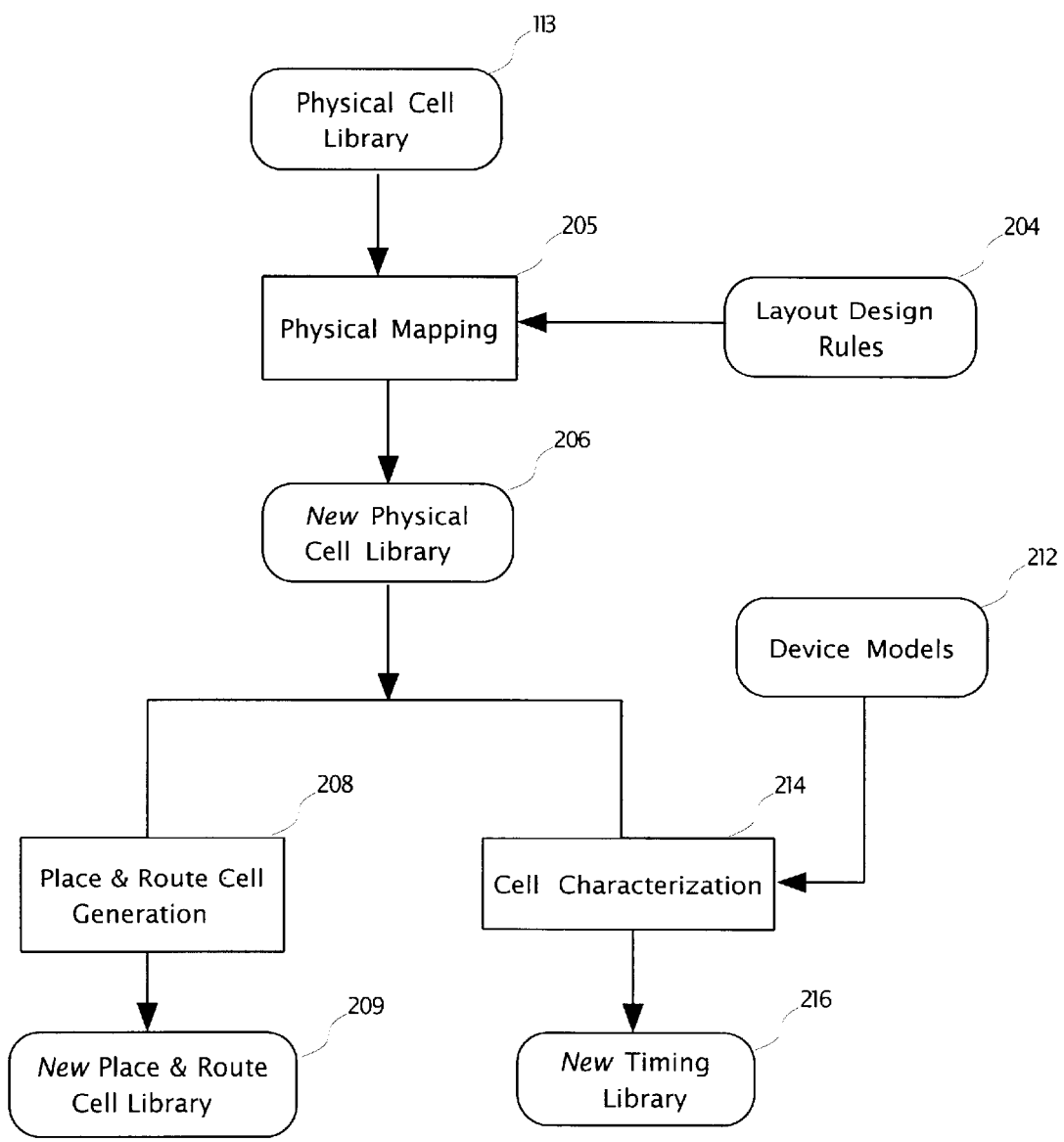
FIG. 2 is a diagram that shows the creation of new Physical, Place and Route, and Timing Libraries for an integrated circuit when the integrated circuit is moved from one process to another process.
Figure 3:
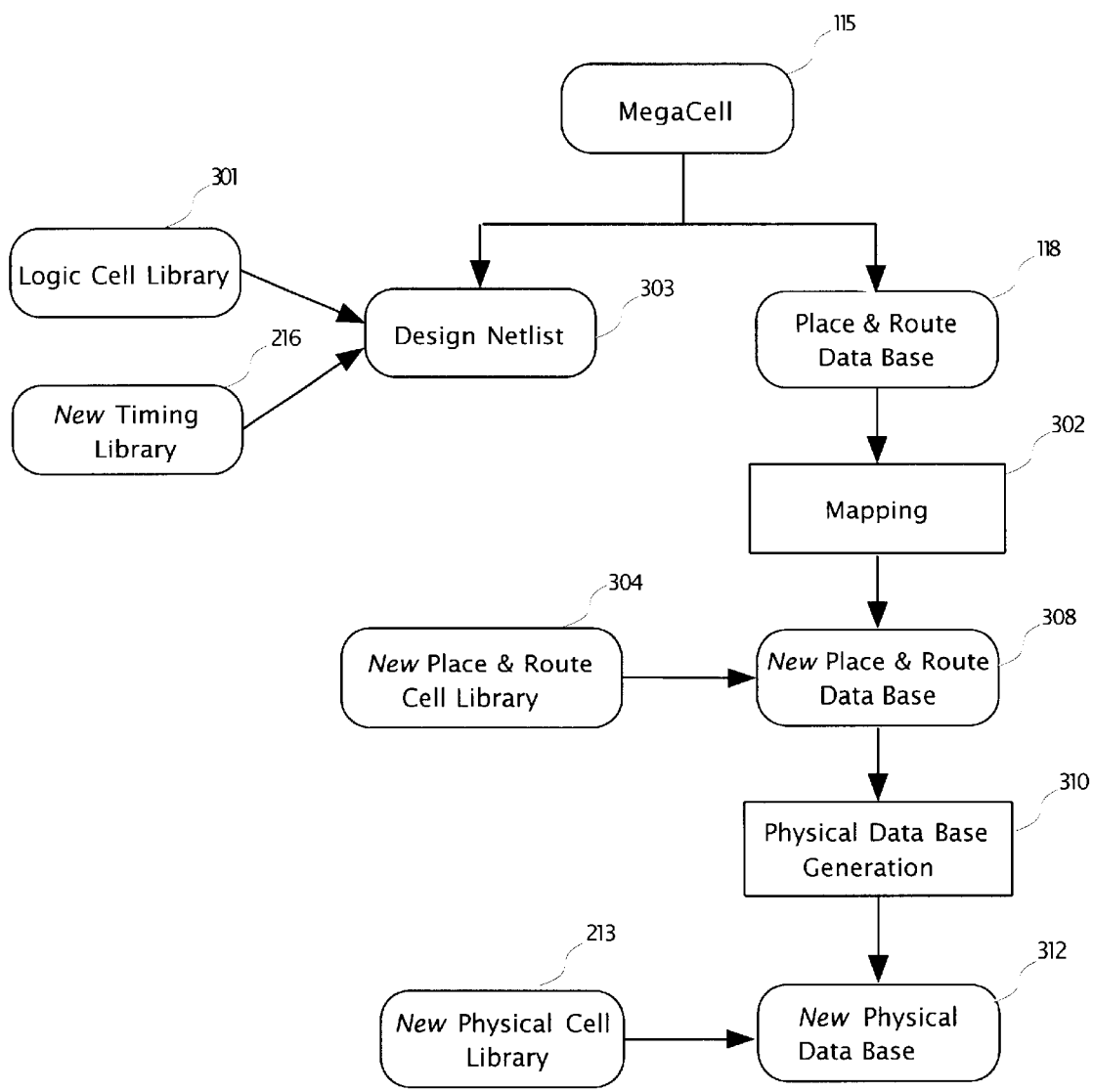
FIG. 3 is a diagram of the production of Physical Database for a new integrated circuit utilizing the second process after the creation of the particular libraries.

FIG. 1 is a diagram that shows the necessary required design flow in the construction of an integrated circuit. FIG. 2 is a diagram that shows the creation of new Physical, Place and Route, and Timing Libraries for an integrated circuit when the integrated circuit is moved from one process to another process. FIG. 3 is a diagram of the production of Physical Database for a new integrated circuit utilizing the second process after the creation of the particular libraries.

Referring now to FIG. 1, what is shown is a diagram of the creation of the important portions of an integrated circuit utilizing a first process. Initially, as is seen a design Netlist 102 is provided, along with the Timing Library 106 and the Logic Library 108 respectively to enable the Logic Simulation 110. Next a Place and Route Cell Library 112 is provided so that the final netlist (integrated circuit) can be placed and routed 114. The end result of the place and route step 114 is wiring information that allows the creation of the integrated circuit 115 for the integrated circuit. The integrated circuit includes the wiring information and the physical information from the Physical Library 113 which after incorporation or merging provides the physical information for the integrated circuit. Accordingly, the integrated circuit 115, as is seen in FIG. 1, comprises three different databases 116–120. The Netlist Database 116 includes the connectivity information providing a full logic description of the integrated circuit. The Place and Route Database 118 describes all the physical connections of the integrated circuit. The integrated circuit also includes the Physical Database 120 which denotes all the physical layers of the integrated circuit. This system can be fully automated, therefore, given these databases, a new integrated circuit can be provided which has all of the above characteristics.

FIG. 2 is a diagram that shows the creation of new libraries required for a new integrated circuit based upon moving that integrated circuit to a different fabrication process. In such a device, the Physical Library 113 from the original manufacturing process along with the layout design rules 204 are physically mapped 205 to produce a new Physical Library 206. The prerequisite for the methodology is the built-in characteristics of the "Physical Library", which is, unlike conventional "custom" cell library, typically more structured, thus lending itself to mapping easily with computing software. This new Physical Cell Library 206 then allows for generation of a new Place and Route Library 209 in step 208. Device models 212 from the new process in conjunction with the new Physical Cell Library 206 allow for recharacterization of the cell library to create a new Timing Library 216. The steps 208 and 214 can be done by computer programs. Through the use of these three libraries 206, 209 and 216, as is seen, along with the other elements of the process, the "building block" libraries of the new process are ready to be used on the integrated circuit.

To more specifically describe this feature, refer now to FIG. 3. In this embodiment, the Logic Cell Library and the new Timing Library 216 along with the design netlist 303 constitute the new circuit model of the integrated circuit 115. The Place and Route Database 118 from the original integrated circuit 115, in conjunction with the new place and route cell library, is mapped 302 into the new Place and Route database 308. The mapping step 302 in this embodiment can be achieved with computer programs. It simply converts cell placements and interconnectivity wires from one coordinate system to another. For example, the coordinate system for the Place and Route Database of the first process may have a grid resolution of 1 microns in the x direction and 2 microns in the y direction; in a second process, the grid resolution could be 0.7 microns in the x direction and 1.2 micron in the y direction, respectively. The new Place and Route Cell Library 304 along with the new Place and Route Database 308 provide the necessary inputs to the physical database generation step 310. In this embodiment a new Physical Database 312 is generated 310 from a new Physical Cell Library 213. In so doing, a completely new database (physical, place & route and netlist) of the integrated circuit are created (generated) for new manufacturing process. Furthermore, this methodology can be applied hierarchically. In other words, this integrated circuit can become a building block of a much bigger, more complex integrated circuit. In this case, the integrated circuit is a megacell (custom cell).

Through a system and method in accordance with the present invention, firstly an integrated circuit is generated essentially from the libraries associated with the integrated circuit and the place and route information. In so doing, a Netlist Database, a Place and Route Database and a Physical Database can be generated therefrom that can be readily implemented into a physical integrated circuit. In addition, when a new manufacturing process is utilized to generate a new integrated circuit, the only things that need to be done are a mapping of the physical cell library, generating new timing models, and finally mapping of the Place and Route Databases Accordingly, this system can be utilized for several different processes across several different technologies to quickly provide an integrated circuit for an integrated circuit.

Accordingly, through this process, a new integrated circuit can be generated that is process independent, that takes a minimal amount of time to design, and that does not require as much modification after the new database is generated.

Although the present invention has been described in accordance with the embodiments shown, one of ordinary skill in the art will readily recognize that there could be variations to the embodiments and those variations would be within the spirit and scope of the present invention. It should be understood that the above-identified process would have application to a gate array cell. That is, a gate array cell manufactured on one process can be transferred to another process utilizing the principles of the present invention. Accordingly, many modifications may be made by one of ordinary skill in the art without departing from the spirit and scope of the appended claims.

What is claimed is:

1. A method for taking a first integrated circuit from a first manufacturing process and generating a second integrated circuit from a second manufacturing process comprising the steps of:

(a) providing a first plurality of libraries from the first integrated circuit, the first plurality of libraries including a timing library, a logic cell library, a place and route cell library and a physical cell library; the first plurality of libraries defining characteristics of the first integrated circuit including routing grid dimensions of the first integrated circuit, the routing grid dimensions of the first integrated circuit being defined by a grid where signal interconnections and cells are placed; and being definable by layout design rules of the first manufacturing process;

(b) mapping the physical cell library based on layout design rules of the second manufacturing process, the layout design rules of the second manufacturing process defining routing grid dimensions for the second integrated circuit;

(c) characterizing the physical cell library and producing a timing library based upon a plurality of device models of the second manufacturing process;

(d) generating a second plurality of libraries including a place and route library; the second plurality of libraries defining characteristics of the second integrated circuit; and (e) utilizing a place and route database of the first manufacturing process and the routing grid dimensions of the first manufacturing process to map into a second place and route data base of the second manufacturing process; the place and route database of the second manufacturing process providing routing grid dimensions in such a manner that the position of the cell placements and interconnections are relatively the same as in the first manufacturing process; the second place and route database defining the second integrated circuit.

2. The method of claim 1 in which the mapping and characterizing steps further comprise the steps of:

(b1) providing a plurality of device models from the second manufacturing process; and (c1) characterizing timing information of new integrated circuit based upon the plurality of device models.

3. The method of claim 1 in which the library generating step (c) further comprises the steps of (c1) generating a new physical library.

4. The method of claim 3 in which the generating step (c) further comprises the step of generating a new timing library.

5. The method of claim 4 in which the database information further, comprises a netlist database and a physical database.

6. A system for taking a first integrated circuit from a first manufacturing process and generating a second integrated circuit from a second manufacturing process comprising the steps of:

means for providing a first plurality of libraries from the first integrated circuit, the first plurality of libraries including a timing library, a logic cell library, a place and route cell library and a physical cell library; the first plurality of libraries defining characteristics of the first integrated circuit including routing grid dimensions of the first integrated circuit, the routing grid dimensions of the first integrated circuit being defined by a grid where signal interconnections and cells are placed and being definable by layout design rules of the first manufacturing process;

means for mapping the physical cell library based on layout design rules of the second manufacturing process, the layout design rules of the second manufacturing process defining routing grid dimensions for the second integrated circuit;

means for characterizing the physical cell library and producing a timing library based upon a plurality of device models of the second manufacturing process;

means for generating a second plurality of libraries including a place and route library; the second plurality of libraries defining characteristics of the second integrated circuit; and means for utilizing a place and route database of the first manufacturing process and the routing grid dimensions of the first manufacturing process to map into a second place and route data base of the second manufacturing process; the place and route database of the second manufacturing process providing routing grid dimensions in such a manner that the position of the cell placements and interconnections are relatively the same as in the first manufacturing process; the second place and route database defining the second integrated circuit.

7. The system of claim 6 in which the mapping and characterizing means further comprises:

means for providing a plurality of device models from the second manufacturing process; and means responsive to the device model providing means characterizing timing information of new integrated circuit based upon the plurality of device models.

8. The system of claim 6 in which the library generating means further comprises:

means for generating a new physical library; and physical generating means for generating the place and route library.

9. The system of claim 8 in which the library generating means further comprises means for generating a new timing library.

10. The system of claim 9 in which the database information comprises, a netlist database and a physical database.

11. The system of claim 6 in which the first and second integrated circuits comprise an first and second gate array cells.

* * * * *